United States Patent
Brearley et al.

[11] Patent Number: 6,099,935
[45] Date of Patent: Aug. 8, 2000

[54] APPARATUS FOR PROVIDING SOLDER INTERCONNECTIONS TO SEMICONDUCTOR AND ELECTRONIC PACKAGING DEVICES

[75] Inventors: William Brearley, Poughkeepsie; Laertis Economikos, Wappingers Falls; Paul F. Findeis, Glenham; Kimberley A. Kelly, Poughkeepsie; Bouwe W. Leenstra, Walden; Arthur Gilman Merryman, Hopewell Juction; Eric Daniel Perfecto, Poughkeepsie; Chandrika Prasad, Wappingers Falls; James Patrick Wood, Beacon; Roy Yu, Wappingers Falls, all of N.Y.

[73] Assignee: International Business Machines Corporation, Armonk, N.Y.

[21] Appl. No.: 08/573,469

[22] Filed: Dec. 15, 1995

[51] Int. Cl.⁷ .................................................. B23K 31/02
[52] U.S. Cl. ......................... 428/119; 428/131; 428/156; 228/180.1; 228/180.21; 228/180.22; 228/245; 228/246; 228/248.1; 228/248.5
[58] Field of Search .................................. 428/156, 131, 428/119; 228/180.1, 180.21, 180.22, 245, 246, 248.1, 248.5

[56] References Cited

U.S. PATENT DOCUMENTS

| | | | |
|---|---|---|---|
| 4,871,110 | 10/1989 | Fukasawa et al. | 228/245 |
| 4,906,823 | 3/1990 | Kushima et al. | 228/245 |
| 5,087,494 | 2/1992 | Calhoun et al. | 428/40 |
| 5,118,027 | 6/1992 | Braun et al. | 228/180.2 |
| 5,219,117 | 6/1993 | Lin | 228/253 |
| 5,316,788 | 5/1994 | Dibble et al. | 427/98 |
| 5,366,140 | 11/1994 | Koskenmaki et al. | 228/246 |
| 5,425,493 | 6/1995 | Interrante et al. | 228/110.1 |
| 5,431,332 | 7/1995 | Kirby et al. | 228/246 |
| 5,492,266 | 2/1996 | Hoebener et al. | 228/248.1 |
| 5,505,367 | 4/1996 | Degani et al. | 228/248.1 |
| 5,586,715 | 12/1996 | Schwiebert et al. | 228/248.1 |
| 5,591,037 | 1/1997 | Jin et al. | 439/91 |
| 5,643,831 | 7/1997 | Ochiai et al. | 437/183 |

FOREIGN PATENT DOCUMENTS 60-234396  11/1985  Japan .

OTHER PUBLICATIONS

Master, et al., "Ceramic Mini–Ball Grid Array Package for High Speed Device", 1995 IEEE Proceedings, 45th Electronic Components & Technology Conference, May 21–24, 1995.

*Primary Examiner*—William P. Watkins, III
*Attorney, Agent, or Firm*—Aziz M. Ahsan

[57] ABSTRACT

An apparatus for use in manufacturing a semiconductor device having input-output (IO) lands arranged in an IO array on an IO face includes a body having a plurality of cavities extending from an operating face into the body; the cavities are arranged in a cavity loci array which is in registeration with the IO lands when the apparatus is in a manufacturing position with the operating face generally adjacent the IO face. Each cavity has a depth and a lateral expanse which cooperate to establish a volume defined by a cavity bottom and at least one cavity wall. The volume accommodates an appropriate amount of solder material to establish a measure of the solder material on a facing IO land when the apparatus is in the manufacturing position. The depth is appropriate to facilitate wettingly attracting the solder material to the facing IO land when the apparatus is in the manufacturing position and the semiconductor device and the apparatus are exposed to appropriate ambient conditions to effect reflow of the solder material. The invention also includes a method for using the apparatus in manufacturing a semiconductor device.

2 Claims, 4 Drawing Sheets

APPARATUS FOR PROVIDING SOLDER INTERCONNECTIONS TO SEMICONDUCTOR AND ELECTRONIC PACKAGING DEVICES

BACKGROUND OF THE INVENTION

The present invention is directed to a method and apparatus for manufacturing a semiconductor device. In particular, the present invention is directed to a method and apparatus for implementing controlled collapse chip connection (C4) input-output (IO) connection structures on a semiconductor device, such as a chip for use in a single-chip or multi-chip module package.

Some prior art apparatuses and methods for creating C4 IO connection structures involve evaporation processes. Evaporation processes suffer from several disadvantages. For example, there is a high cost associated with equipping and operating an evaporation process. Further, evaporation processes provide a low throughput because the process is slow to achieve. Still further, there is a high cost associated with the production of the required masks for implementing an evaporation process, and the masks are only usable for very few repeat applications before material build-up and other factors require their replacement. Evaporation processes are limited to using only certain varieties of solder material. Moreover, there is limited density attainable for C4 IO connection arrays using evaporation technology.

C4 IO connection structures have also been created using plating processes. Plating processes have significant disadvantages vis-a-vis C4 IO connection structures. Plating processes are often complex in terms of the materials used and precise combinations of those materials. The conditions under which the materials are used, such as temperatures and durations of processing steps, often must be precisely controlled. There is, therefore, a high cost associated with such plating processes; plating baths must be monitored and replenished precisely, and yields are often adversely affected in discovering when bath replacement is necessary. Another problem is that plating processes have low throughput since there are frequent interruptions to ensure integrity of the baths and other aspects of the process. Further, plating processes are also limited to employment with only certain varieties of solder.

What is needed is an apparatus and method for depositing solder ball connection structures for implementing controlled collapse chip connection (C4) input-output (IO) connection structures on a semiconductor device such as a chip for use in a single-chip or multi-chip module package.

SUMMARY OF THE INVENTION

The invention is an apparatus for use in manufacturing a semiconductor device having a plurality of input-output (IO) lands. For purposes of this disclosure, the term semiconductor device is intended to include semiconductor chips, semiconductor wafers, and substrate materials used in packaging semiconductor chips and modules, such as ceramic substrates and organic laminate substrates. The plurality of IO lands is arranged in a predetermined array on a generally planar IO face of the semiconductor device. At least some of the IO lands are electrically coupled with components within the semiconductor device. The apparatus includes a body having a substantially planar operating face and a plurality of cavities extending from the operating face into the body. Preferably the operating face is comprised of a material having a thermal coefficient of expansion (TCE) substantially matching the TCE of semiconductor device materials with which the apparatus will be used, such as Silicon (Si) or Silicon-Germanium (SiGe). The cavities are arranged in a cavity loci array which is substantially in registeration with the predetermined array of IO lands when the apparatus is in a manufacturing position, with the operating face generally adjacent the IO face. In the case of an apparatus for applying solder to semiconductor chips the spacing between cavities is 10 mil or less. Each respective cavity has a predetermined depth and a predetermined lateral expanse which cooperate to establish a volume defined by a cavity bottom and at least one cavity wall. If the cavity is generally cylindrical in shape, there will be a single cavity wall. Alternatively, the cavity may be generally hemispherical in shape or there may be a plurality of cavity walls, which will result in the cavity being generally polygonal in sections parallel with the operating face. Further, there may be an access aperture from outside the apparatus to the cavity to vent the cavity as it is filled with solder material. Such an access aperture may also be useful during screening operations by applying low pressure to the access aperture to facilitate filling the cavity with solder material and urging the apparatus against the substrate. Further, the access aperture may as well be useful in cleaning operations involving the apparatus by facilitating access to the cavity. Preferably, such an access aperture (if one is present) intersects a respective cavity generally at the bottom of the cavity, but the access aperture may intersect the cavity anywhere. The intersection site depends on the particular purpose for which the cavity is intended. The volume of the cavity accommodates an appropriate amount of solder material to establish a predetermined measure of the solder material on a facing IO land when the apparatus is in the manufacturing position. The depth is appropriate to facilitate wettingly attracting the solder material to the facing IO land when the apparatus is in the manufacturing position and the semiconductor device and the apparatus are subjected to appropriate ambient conditions to effect reflow of the solder material.

The invention also contemplates and includes a method for use in manufacturing a semiconductor device having a plurality of input-output (IO) lands arranged in a predetermined array on a generally planar IO face of the semiconductor device. At least some of the IO lands are coupled with components within the semiconductor device. The method includes the steps of first providing a reflow apparatus, the reflow apparatus including a body having a substantially planar operating face and a plurality of cavities extending from the operating face into the body. The cavities are arranged in a cavity loci array which is substantially in register with the predetermined array when the apparatus is in a manufacturing position with the operating face generally adjacent the IO face. Second, the cavities are substantially filled with a solder material. Each respective cavity has a predetermined depth and a predetermined lateral expanse which cooperate to establish a volume defined by a cavity bottom and at least one cavity wall. The volume accommodates an appropriate amount of the solder material to establish a predetermined measure of the solder material on a facing IO land of the plurality of IO lands when the apparatus is in the manufacturing position. The depth is appropriate to facilitate wettingly attracting the solder material to the facing IO land when the apparatus is in the manufacturing position and the apparatus and the semiconductor device are subjected to appropriate ambient conditions to effect reflow of the solder material. Third, the apparatus and the semiconductor device are placed in the manufacturing position; and fourth, the apparatus and the semiconductor device are exposed to the ambient conditions.

In its preferred embodiment, the invention is an apparatus and method for use in depositing solder ball connection structures to input-output (IO) pads of a semiconductor device. In the preferred embodiment, each cavity includes a protrusion extending from the bottom an extension distance which is less than the depth of the cavity. The protrusion is preferably substantially centrally located within the cavity, and the at least one wall extends to the depth substantially everywhere about the protrusion.

It is, therefore, an object of the present invention to provide an apparatus and method for use in manufacturing a semiconductor device which is useful in depositing solder material on input-output (IO) pads of the semiconductor device.

It is also an object of the present invention to provide an apparatus and method for use in manufacturing a semiconductor device which is useful in depositing solder ball connection structures to IO pads on the semiconductor device.

It is yet a further object of the present invention to provide an apparatus and method for use in manufacturing a semiconductor device which have lower operating overhead and higher throughput for depositing solder ball connection structures to IO pads of a semiconductor device than are provided by prior art evaporation processes and plating processes.

Further objects and features of the present invention will be apparent from the following specification and claims when considered in connection with the accompanying drawings illustrating the preferred embodiment of the invention.

DETAILED DESCRIPTION OF THE INVENTION

Figure 1:
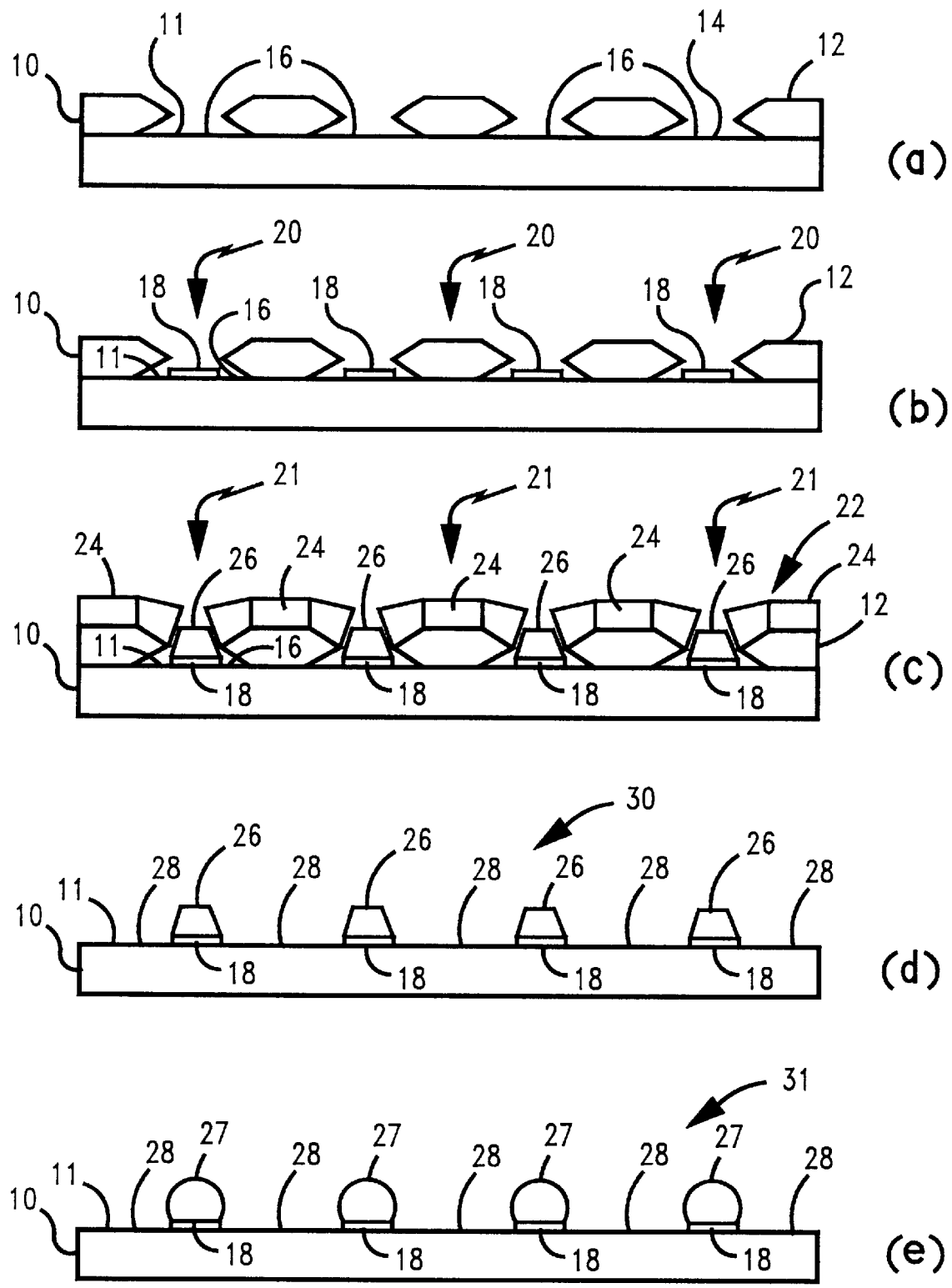
FIGS. 1(a), 1(b), 1(c), 1(d), 1(e) are a series of schematic drawings illustrating a prior art evaporation process for creating C4 IO solder ball connection structures.

FIG. 1 is a series of schematic drawings (a)–(e) illustrating a prior art evaporation process for creating C4 IO solder ball connection structures. In FIG. 1 (a), a substrate 10 has a mask 12 applied to a face 11. Mask 12 is shown schematically in section as presenting mask apertures 14 defining selected exposed portions 16 on face 11. FIG. 1 (b) schematically represents performance of an evaporation operation (indicated by arrows 20) to deposit input-output (IO) lands 18 on exposed portions 16. At least some of IO lands 18 are electrically coupled with components or electrical circuitry within substrate 10 (not shown in FIG. 1). IO lands 18 are generally composed of durable electrically conductive materials, such as copper (Cu), tungsten (W), chromium (Cr), nickel (Ni), titanium (Ti), gold (Au), or similar materials, or alloys of such materials.

FIG. 1(c) schematically represents evaporative application of solder material 22 (indicated by arrows 21) onto substrate 10 and mask 12. During such solder evaporation, solder material 22 collects upon mask 12, indicated as mask solder deposits 24; and solder material 22 also collects upon IO lands 18, indicated as IO solder deposits 26. As indicated by FIG. 1(d), mask 12 is removed and carries away mask solder deposits 24. Face 11 now has an IO array 30 of IO lands 18 with attached IO solder deposits 26, and a plurality of interstices 28. Substrate 10 is preferably comprised of electrically insulative material or semiconductive material, so interstices 28 on face 11 insulate respective IO lands 18 from each other.

FIG. 1(e) represents resulting structure following a reflow operation. When substrate 10 with IO array 30, including IO lands 18 and IO solder deposits 26, is exposed to ambient conditions appropriate to effect reflow of solder making up IO solder deposits 26, IO solder deposits 26 reflow to form solder balls 27. For example, reflow for 97/3 solder material may occur in an ambient temperature of 355° C. Solder balls 27 wettingly adhere to 10 lands 18 and do not extend to interstices 28. The resulting IO array 31 presents substantially uniformly sized and substantially uniformly shaped solder ball connection structures (IO lands 18 and attached solder balls 27) for controlled collapse chip connection (C4) affixation to another component (not shown in FIG. 1).

There are drawbacks to the prior art C4 evaporation process illustrated in FIG. 1. The cost of capital equipment to perform evaporation processing on a production level is high. There is low throughput of products using the evaporation system of FIG. 1; for example, approximately six wafers may be processed per five-hour processing run. The cost of operation of the process is high, principally because the masks (e.g., mask 12, FIG. 1) are precision components (high cost) which are not usable for many, if any, repeat cycles because of solder buildup (e.g., mask solder deposits 24, FIG. 1). The evaporation is acceptably effective only with limited solder materials, and there is limited density available for resulting IO array 31 of solder balls 27 using evaporation technology.

Figure 2:
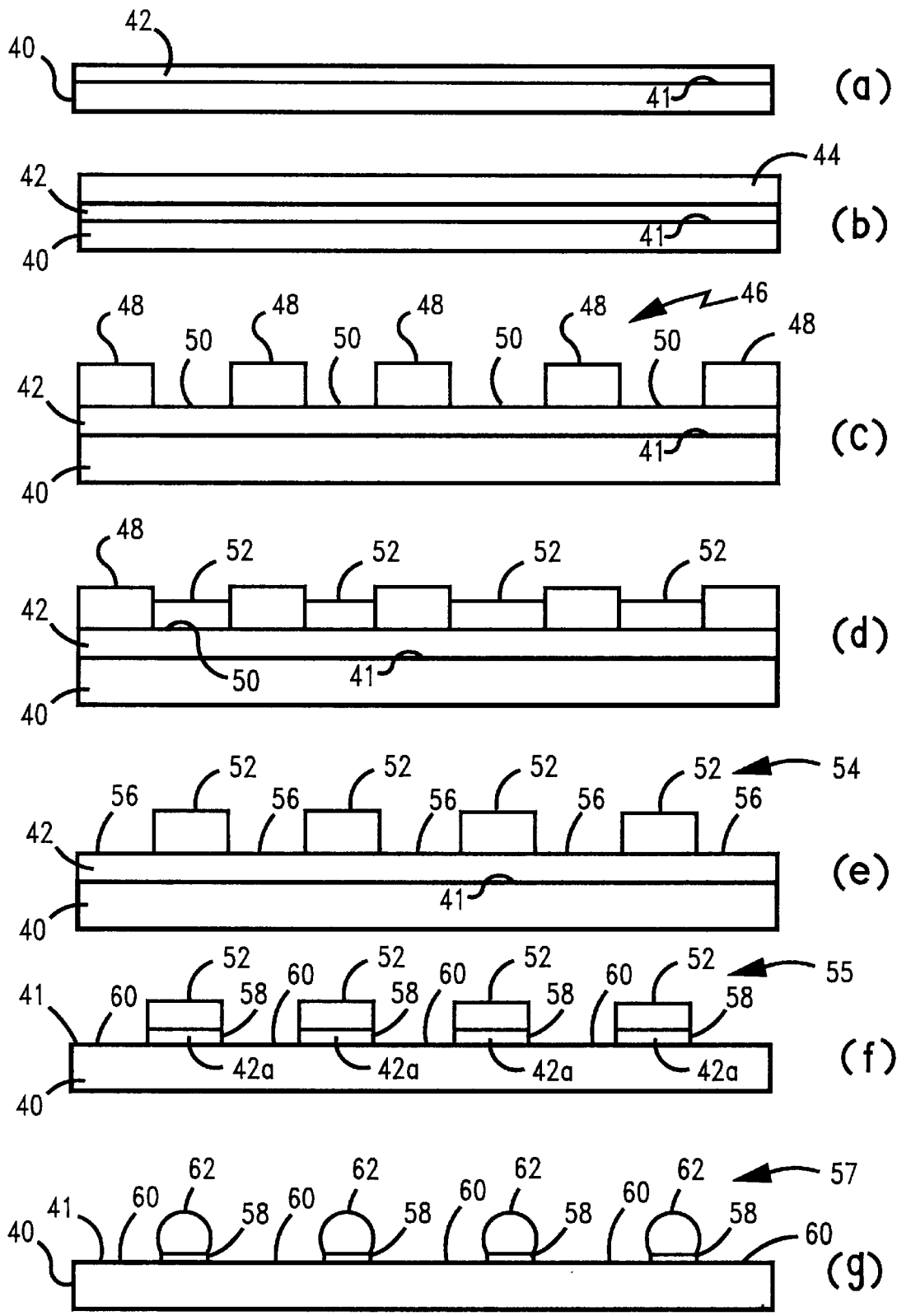
FIGS. 2(a), 2(b), 2(c), 2(d), 2(e), 2(f), 2(g) are a series of schematic drawings illustrating a prior art plating process for creating C4 IO solder ball connection structures

FIG. 2 is a series of schematic drawings (a)–(g) illustrating a prior art plating process for creating C4 IO solder ball connection structures. In FIG. 2(a), a substrate 40 of electrically insulative material has a face 41 which is covered with a metallic layer 42. Metallic layer 42 may be deposited, for example, using a seed sputtering operation. Metallic layer 42 is generally composed of durable electrically conductive materials, such as copper (Cu), tungsten (W), chromium (Cr), nickel (Ni), molybdenum (Mo), or similar materials, or alloys of such materials. FIG. 2(b) represents application of a photoresist material 44 substantially covering metallic layer 42. Photoresist material 44 is exposed and developed according to lithographic processes known in the art of semiconductor manufacture to provide a pattern 46 (FIG. 2c) of photoresist islands 48 and exposed portions 50 of metallic layer 42.

FIG. 2(d) represents a structure resulting after subjecting the structure illustrated in FIG. 2(c) to a plating operation. In FIG. 2(d), solder deposits 52 are platingly applied to metallic layer 42 in exposed portions 50. FIG. 2(e) illustrates the resulting structure after the structure illustrated in FIG. 2(d) is subjected to a stripping operation by which photoresist material present in the form of photoresist islands 48 is stripped away. The resulting structure includes substrate 40, metallic layer 42, and an array 54 of solder deposits 52. The stripping away of photoresist islands 48 leaves newly exposed areas 56 of metallic layer 42 surrounding solder deposits 52.

FIG. 2(f) represents the resulting structure after the structure in FIG. 2(e) is exposed to an etching operation by which newly exposed areas 56 are etched away. As indicated by FIG. 2(f), face 11 now has an IO array 55 of segments 42a of metallic layer 42. Segments 42a are IO lands 58 with attached solder deposits 52 and a plurality of interstices 60. Because substrate 40 is preferably comprised of electrically insulative material, interstices 62 on face 41 insulate respective IO lands 58 from each other.

FIG. 2(g) represents the resulting structure following a reflow operation. When substrate 40 with IO array 55, including IO lands 58 and solder deposits 52, is exposed to ambient conditions appropriate to effect reflow of solder making up solder deposits 52, solder deposits 52 reflow to form solder balls 62. For example, reflow for 97/3 solder material may occur in an ambient temperature of 355° C. Solder balls 62 wettingly adhere to IO lands 58 and do not extend to interstices 60. The resulting IO array 57 presents substantially uniformly sized and substantially uniformly shaped solder ball connection structures (IO lands 58 and attached solder balls 62) for controlled collapse chip connection (C4) affixation to another component (not shown in FIG. 2).

Figure 3:
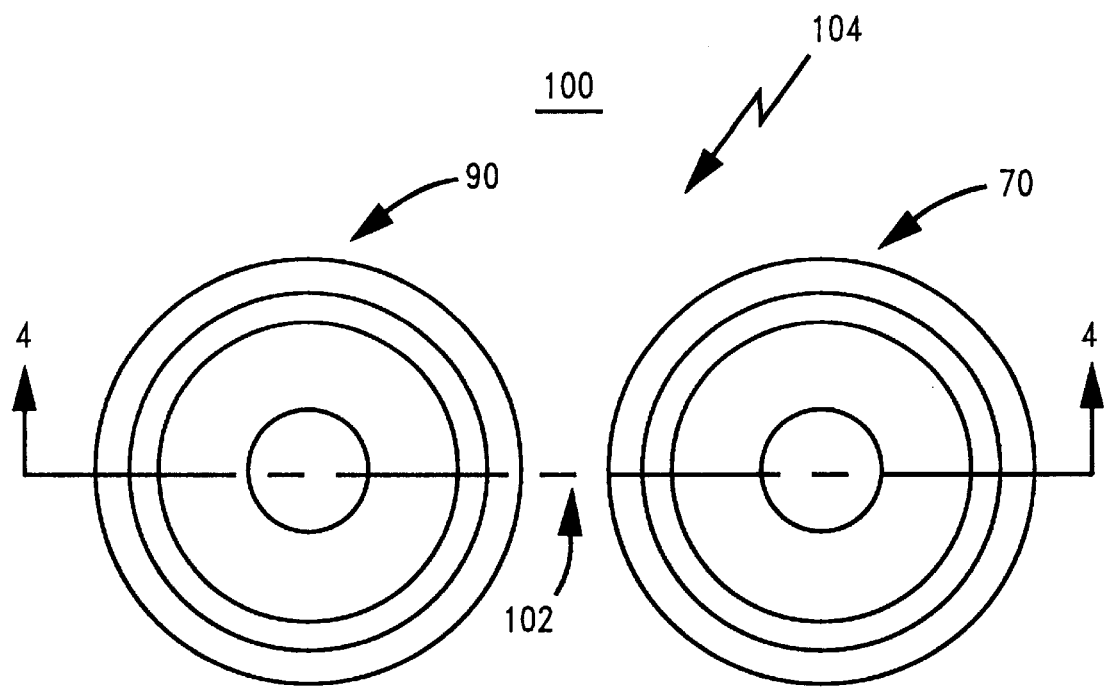
FIG. 3 is a schematic drawing in a top plan view of two adjacent cavities of the apparatus of the present invention.
Figure 4:
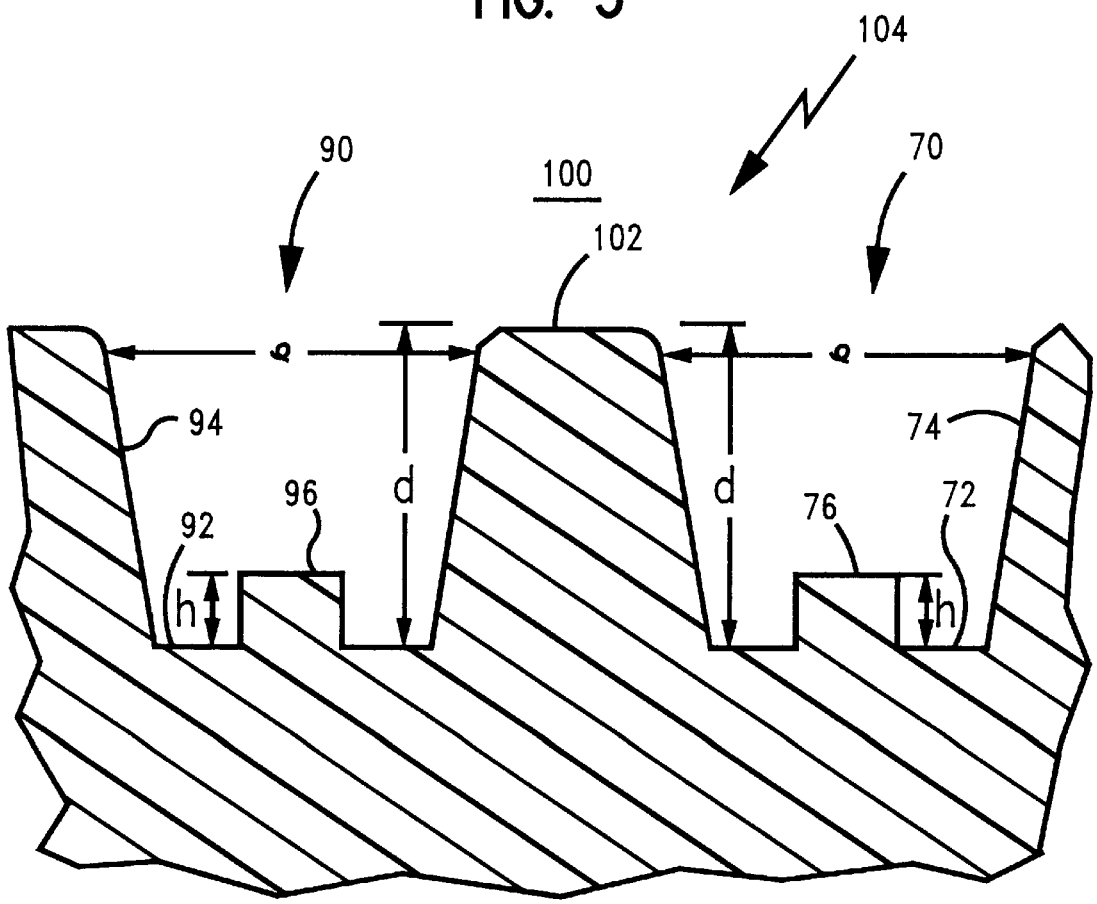
FIG. 4 is a schematic section view of the cavities illustrated in FIG. 3, taken along Section 4—4 in FIG. 3.

FIG. 3 is a schematic drawing in a top plan view of two adjacent cavities of the apparatus of the present invention. FIG. 4 is a schematic section view of the cavities illustrated in FIG. 3, taken along Section 4—4 in FIG. 3. In FIGS. 3 and 4, substantially similar adjacent cavities 70, 90 in a depositor, or body 100, extend from an operating face 102 of body 100 into body 100. Cavities 70, 90 are arranged in a cavity loci array 104. Each cavity 70, 90 has a depth "d" and a lateral expanse "e". Depth "d" and lateral expanse "e" cooperate to establish a predetermined volume of each of cavities 70, 90 defined by cavity bottoms 72, 92 and cavity walls 74, 94. In the preferred embodiment illustrated in FIGS. 3 and 4, each cavity 70, 90 is substantially cylindrical in sections parallel with operating face 102, so each cavity 70, 90 has a single wall 74, 94. Alternatively, cavities 70, 90 could be polygonal in sections parallel with operating face 102. In such an alternate configuration, each cavity 70, 90 would have a plurality of walls (not shown in FIGS. 3–4). In the preferred embodiment of the apparatus of the present invention, each cavity 70, 90 has a protrusion 76, 96 substantially centrally located within cavity 70, 90. Protrusions 76, 96 extend from cavity bottoms 72, 92 toward operating face 102 an extension distance "h". Extension distance "h" is preferably less than depth "d".

Figure 5:
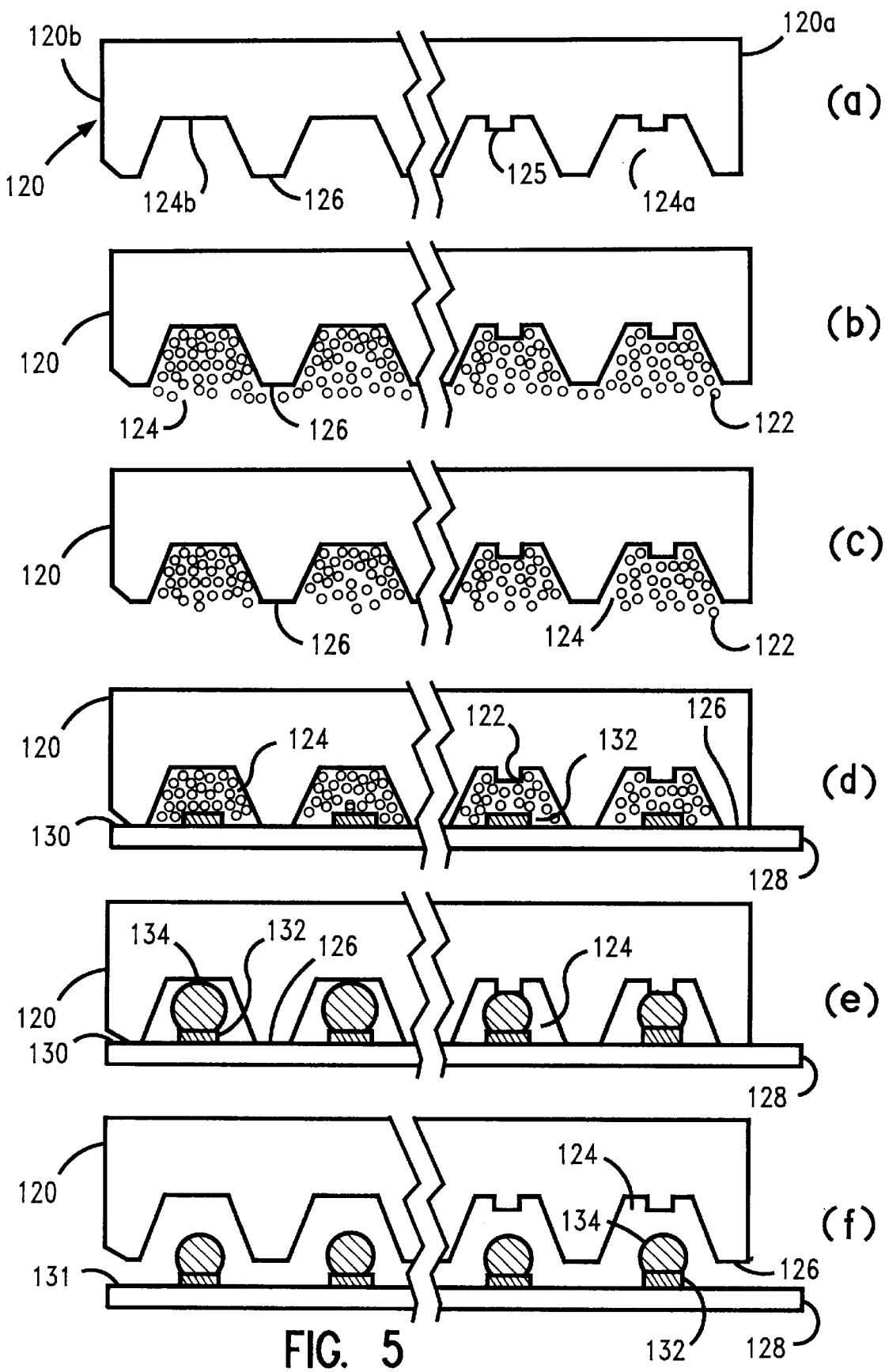
FIGS. 5(a), 5(b), 5(c), 5(d), 5(e), 5(f) are a series of schematic drawings illustrating the method of the present invention. Further structural details of the apparatus of the present invention may also be determined from FIG. 5.

FIG. 5 is a series of schematic drawings (a)–(f) illustrating the method of the present invention. Further structural details of the apparatus of the present invention may also be determined from FIG. 5. In FIG. 5(a), a reflow apparatus 120 is provided. Reflow apparatus 120 is illustrated in FIG. 5(a) in a preferred embodiment 120a and an alternate embodiment 120b. Preferred reflow apparatus 120a has cavities 124a configured substantially as described in connection with FIGS. 3–4. That is, reflow apparatus 120a has cavities 124a with a protrusion 125 (similar to protrusions 76, 96 in FIG. 4). Alternate reflow apparatus 120b has cavities 124b; cavities 124b having no protrusions. In order to simplify the description of the invention, a single reference numeral will designate reflow apparatus 120, and a single reference numeral will designate cavities 124 hereinafter.

Preferably, reflow apparatus 120 is prepared using a glass mask which is etched to the mirror image of the desired C4 connection structure array. The etching is made to a desired depth (e.g., depth "d", FIG. 4) and a desired expanse (e.g., expanse "e", FIG. 4). Glass material is preferred for reflow apparatus 120 because of its transparency, which facilitates alignment and inspection during operations involving reflow apparatus 120. A further advantage of glass material is that the thermal coefficient of expansion (TCE) of glass approximately matches the TCE of semiconductor wafer material. As illustrated in FIG. 5(b), solder material 122 (e.g., solder paste) is introduced into cavities 124, preferably by screening methods. As illustrated in FIG. 5(c), excess solder material 122 is removed from operating face 126 of reflow apparatus 120 (reflow apparatus 120 may be characterized as a depositor).

In FIG. 5(d), a substrate 128 is illustrated in a manufacturing position with respect to reflow apparatus 120. Substrate 128 may include ceramic substrate material, organic laminate substrate material, or a semiconductor device. Substrate 128 has a plurality of IO lands 132 arrayed on an IO face 130. When in the manufacturing position illustrated in FIG. 5(d), each IO land 132 is substantially in registeration with a cavity 124, and IO face 132 is substantially adjacent and substantially abutting operating face 126. In FIG. 5(e), reflow apparatus 120 and substrate 128 have been subjected to ambient conditions appropriate to effect reflow of solder material 122. By way of example, if solder material 122 is 97/3 solder, reflow apparatus 120 and substrate 128 are subjected to a temperature of approximately 355° Centigrade. Other solder materials are also known to be compatible with the apparatus and method of the present invention, such as eutectic tin-lead solder material and non-lead solder material. As will be recognized by those skilled in the art, when solder material 122 is subjected to appropriate ambient conditions to effect reflow, solder material 122 will reflow to a plurality of solder balls 134 confined to IO lands 132 and within cavities 124., as illustrated in FIG. 5(e). As a practical matter, if solder material 122 is configured to contain an appropriate amount and type of flux, the proper reflow of solder material 122 into solder balls 134 may be more reliably assured. In FIG. 5(e), one may note that solder balls 134 are in contact with the interiors of cavities 124 so that an impression (not shown in detail in FIG. 5) is left in each solder ball 134. The dimensions of cavities 124 must be carefully determined and controlled to ensure that each cavity 124 will accommodate an appropriate amount of solder material 122 to produce a desired size of solder ball 134. A further constraint on the dimensions of cavities 124 is that there must be an assured attraction of solder material 122 to IO lands 132 by wettingly attracting and adhering solder material 122 to IO lands 132 to form solder balls 134 during reflow. Tolerances in meeting such restrictions in fashioning cavities 122 virtually assure that there will be contact between solder balls 134 and cavities 124 in performing the method of the present invention using the apparatus of the present invention. Such an imperfection as an impression in solder balls 134 is an unacceptable shape aberration in the finely controlled environment in which C4 contact structures (e.g., solder balls 134) are employed. There must be as few aberrations as possible because there are enough manufacturing problems to overcome to repeatably and reliably establish good contacts for all solder balls 134 when substrate 128 is later electrically coupled with another device, such as a single-chip or a multi-chip semiconductor module. Thus, it is desirable to eliminate the impressions on solder balls 134 left by their contact with cavities 124.

FIG. 5(f) illustrates a manufacturing step intended to eliminate the impressions on solder balls 134 caused by contact between solder balls 134 and cavities 124. In FIG. 5(2f), substrate 128 and reflow apparatus 120 have been separated a distance sufficient to separate solder balls 134 from contact with cavities 124. The step illustrated in FIG. 5(*f*) is conducted under ambient conditions appropriate to effect reflow of solder balls 134. During such reflow, solder balls 134, now not contacting cavities 124, reflow to a truer ball shape with no impression of a cavity 124. The step illustrated in FIG. 5(2*f*) may be carried out immediately after the step illustrated in FIG. 5(2*e*), taking advantage of the same ambient conditions established in connection with the step illustrated in FIG. 5(*e*). Alternatively, the separation of substrate 128 and reflow apparatus 120 may be effected under the ambient conditions of FIG. 5(*e*), substrate 128 may then be allowed to cool, and the second reflow by solder balls 134 may be effected later under renewed ambient conditions appropriate to effect the required reflow of solder balls 134.

The apparatus and method of the present invention is particularly valuable since the apparatus and method may easily be employed with various wafer sizes in semiconductor manufacturing. This is especially the case if reflow apparatus 120 is manufactured of a material having a thermal coefficient of expansion (TCE) close to the TCE of substrate 128. Further, since the mask which is etched to form cavities 124 is made with a photo (e.g., lithographic) process, the density, or pitch, of spacing of C4 solder connection structures (i.e., solder balls 134) can be controlled to close standards, allowing high density C4 connection structure arrays.

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. A soldering apparatus for applying solder to a high density plurality of IO lands on electronic semiconductor chip structures comprising:

a substantially planar plate having a high density plurality of cavities with 10 mil or less spacing between cavities, wherein each of said cavities further comprises a protrusion extending from the bottom of said cavity and extending a distance which is less than the depth of the cavity; and solder paste disposed in, but not extending beyond, each one of said high density plurality of cavities.

2. The apparatus of claim 1 wherein each protrusion in each of said cavities is substantially centrally located in said cavity.

* * * * *